(12) United States Patent
Sugizaki (10) Patent No.: US 8,319,246 B2
(45) Date of Patent: Nov. 27, 2012

(54) SEMICONDUCTOR DEVICE AND METHOD FOR MANUFACTURING SAME

(75) Inventor: Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 12/706,366

(22) Filed: Feb. 16, 2010

(65) Prior Publication Data
US 2011/0073900 A1 Mar. 31, 2011

(30) Foreign Application Priority Data
Sep. 25, 2009 (JP) ................................. 2009-220436

(51) Int. Cl.
*H01L 33/00* (2010.01)

(52) U.S. Cl. .......... 257/99; 257/737; 257/738; 257/748; 257/E21.508; 438/105; 438/106; 438/108; 438/110; 438/112

(58) Field of Classification Search ........................ None
See application file for complete search history.

(56) References Cited

U.S. PATENT DOCUMENTS

| | | | |
|---|---|---|---|
| 6,580,152 B2 | 6/2003 | Hasegawa | |
| 2002/0121692 A1* | 9/2002 | Lee et al. ...................... | 257/737 |
| 2004/0043675 A1 | 3/2004 | Hiatt et al. | |
| 2004/0134974 A1 | 7/2004 | Oh et al. | |
| 2005/0208751 A1 | 9/2005 | Oh et al. | |
| 2006/0001141 A1 | 1/2006 | Hiatt et al. | |
| 2007/0018321 A1 | 1/2007 | Hiatt et al. | |
| 2007/0252274 A1 | 11/2007 | Daubenspeck et al. | |
| 2008/0122085 A1 | 5/2008 | Kanaoka et al. | |
| 2008/0142864 A1 | 6/2008 | Takahashi et al. | |
| 2009/0085205 A1 | 4/2009 | Sugizaki | |
| 2009/0137075 A1 | 5/2009 | Yang et al. | |
| 2010/0155941 A1 | 6/2010 | Matsuki et al. | |
| 2010/0203721 A1 | 8/2010 | Hiatt et al. | |
| 2010/0252924 A1 | 10/2010 | Kanaoka et al. | |
| 2010/0267214 A1 | 10/2010 | Takahashi et al. | |

FOREIGN PATENT DOCUMENTS

| | | |
|---|---|---|
| EP | 2 063 469 A2 | 5/2009 |
| JP | 10-163536 | 6/1998 |
| JP | 2000-228423 | 8/2000 |
| JP | 2000-244012 | 9/2000 |
| JP | 2002-016069 | 1/2002 |

(Continued)

OTHER PUBLICATIONS

Japanese Office Action issued Jan. 31, 2012, in Patent Application No. 2009-220436 (with English-language translation).

(Continued)

*Primary Examiner* — N Drew Richards
*Assistant Examiner* — Kyoung Lee
(74) *Attorney, Agent, or Firm* — Oblon, Spivak, McClelland, Maier & Neustadt, L.L.P.

(57) ABSTRACT

A semiconductor device includes: a semiconductor structure unit; an interconnect layer provided on the major surface side of the semiconductor structure unit; an electrode pad provided on a surface of the interconnect layer on a side opposite to a surface on which the semiconductor structure unit is provided, and the electrode pad electrically connected to the interconnect layer; a plurality of metal pillars joined to the electrode pad separately from each other; and an external terminal provided commonly at tips of the plurality of metal pillars, the metal pillars having an area in a plan view smaller than an area in a plan view of the external terminal.

19 Claims, 10 Drawing Sheets

FOREIGN PATENT DOCUMENTS

| | | |
|---|---|---|
| JP | 2002-118293 | 4/2002 |
| JP | 2006-114820 | 4/2006 |
| JP | 2006-287048 | 10/2006 |
| JP | 2006-287049 | 10/2006 |
| JP | 2008-84920 | 4/2008 |
| JP | 2008-187197 | 8/2008 |
| JP | 2008-258445 | 10/2008 |
| WO | WO 2009/013826 A1 | 1/2009 |

OTHER PUBLICATIONS

U.S. Appl. No. 12/505,759, filed Jul. 20, 2009, Yoshiaki Sugizaki.

Office Action (with Engish translation) mailed on Sep. 4, 2012, in counterpart Japanese Patent Appln No. 2009-220436 (5 pages).

* cited by examiner

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-220436, filed on Sep. 25, 2009; the entire contents of which are incorporated herein by reference.

BACKGROUND

Flip chip mounting is known as a method for mounting a semiconductor chip on a circuit substrate and the like. This is suitable for an apparatus that requires small size and/or thinness strongly. Furthermore, since this method allows heat of chip to transmit easily to a substrate, it is also used for mounting light-emitting diodes that may cause a problem of heat generation.

In the flip chip mounting, a chip is joined to a substrate via a protruding terminal called as a bump. Further, a structure in which a columnar metal is interposed between an electrode pad of a chip and a bump is also known (e.g. JP-A 2008-84920 (Kokai)). The columnar metal absorbs stress caused by a difference in coefficient of thermal expansion between the chip and the substrate; therefore, joining reliability can be enhanced.

The higher the aspect ratio (ratio of height to width) of the columnar metal is, the higher stress relaxation effects are. In order to increase the aspect ratio of the columnar metal, the columnar metal may be made thin or high. However, if the columnar metal is thin, concerns remain in regard to reduced joining strength due to the reduced area of joining to the bump. Furthermore, heightening the columnar metal increases plating cost for forming the columnar metal, and goes against the requirement of reducing thickness.

SUMMARY

According to an aspect of the invention, there is provide a semiconductor device including: a semiconductor structure unit including a major surface; an interconnect layer provided on the major surface side of the semiconductor structure unit; an electrode pad provided on a surface of the interconnect layer on a side opposite to a surface on which the semiconductor structure unit is provided, and the electrode pad electrically connected to the interconnect layer; a plurality of metal pillars joined to the electrode pad separately from each other; and an external terminal provided commonly at tips of the plurality of metal pillars, the metal pillars having an area in a plan view smaller than an area in a plan view of the external terminal.

According to another aspect of the invention, there is provide a method for manufacturing a semiconductor device including: forming an interconnect layer on a major surface of a semiconductor structure unit; forming an electrode pad on a surface of the interconnect layer on a side opposite to a surface on which the semiconductor structure unit is provided; forming an insulating member covering the electrode pad; forming a plurality of holes penetrating through the insulating member to reach the electrode pad in the insulating member; forming metal pillars in the holes; and providing an external terminal commonly joined to tips of the plurality of metal pillars and the external terminal having an area in a plan view larger than an area in a plan view of each of the metal pillars.

BRIEF DESCRIPTION OF THE DRAWINGS

FIGS. 3A to 8B are schematic cross-sectional views of a method for manufacturing the semiconductor device;

DETAILED DESCRIPTION

Embodiments of the invention will now be described with reference to the drawings. In the drawings, similar components are marked with the same reference letter.

Figure 1:
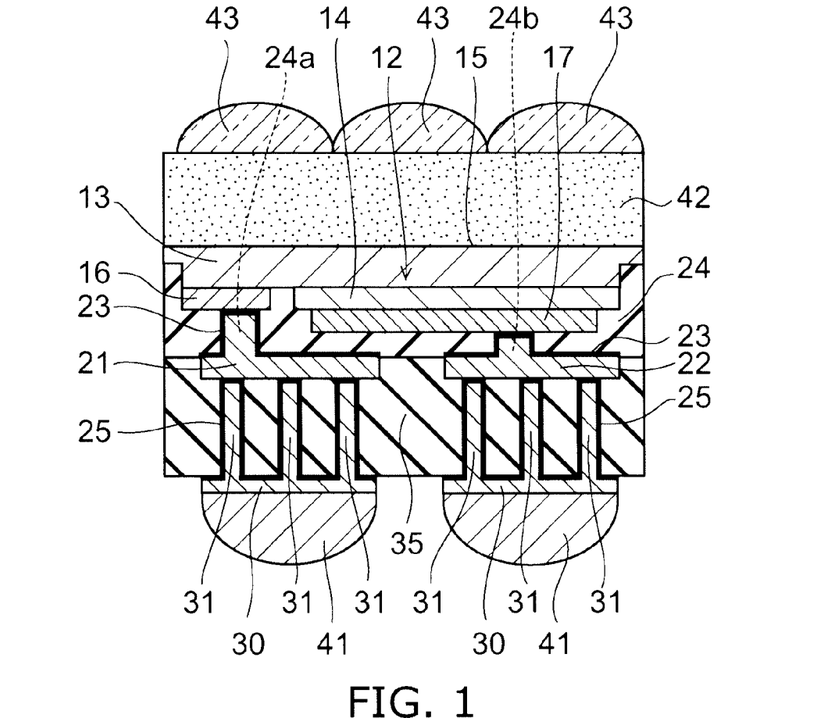
FIG. 1 is a schematic cross-sectional view of a semiconductor device according to an embodiment.

FIG. 1 is a schematic cross-sectional view of a semiconductor device according to an embodiment. In this embodiment, a description is given while taking a semiconductor light-emitting device as an example of the semiconductor device.

A semiconductor device according to this embodiment includes a light-emitting element 12 as a semiconductor structure unit. The light-emitting element 12 includes a first semiconductor layer 13 and a second semiconductor layer 14. The second semiconductor layer 14 has a structure in which a light-emitting layer (or active layer) is placed between a p-type cladding layer and an n-type cladding layer. The first semiconductor layer 13 is n-type, for example, and functions as a lateral-direction pathway of a current. However, the conductivity type of the first semiconductor layer 13 is not limited to n-type but may be p-type.

A first major surface of the first semiconductor layer 13 functions as a light extraction surface 15. The second semiconductor layer 14 is provided on a second major surface on the side opposite to the light extraction surface 15. The second semiconductor layer 14 has a smaller planar size than the first semiconductor layer 13.

An interconnect layer is provided on a surface of the light-emitting element 12 on the side opposite to the light extraction surface 15. The interconnect layer includes an n-side electrode 16, a p-side electrode 17, and an insulating film 24.

The n-side electrode 16 is formed on a portion of the second major surface of the first semiconductor layer 13 on which the second semiconductor layer 14 is not provided. The p-side electrode 17 is formed on a surface of the second semiconductor layer 14 on the side opposite to the surface in contact with the first semiconductor layer 13.

A surface of the light-emitting element 12 on the side opposite to the light extraction surface 15 is covered with the insulating film 24, and the n-side electrode 16 and the p-side electrode 17 are also covered with the insulating film 24. The insulating film 24 is an organic insulating film such as a polyimide film.

An n-side electrode pad 21 and a p-side electrode pad 22, which are separated from each other, are formed on a surface of the insulating film 24 on the side opposite to the surface on which the light-emitting element 12 is provided. The n-side electrode pad 21 is provided also in an opening 24a that is formed in the insulating film 24 to reach the n-side electrode 16, and is electrically connected to the n-side electrode 16. The p-side electrode pad 22 is provided also in an opening 24b that is formed in the insulating film 24 to reach the p-side electrode 17, and is electrically connected to the p-side electrode 17. The n-side electrode pad 21 and the p-side electrode pad 22 are formed by, for example, the electrolytic plating method using a seed metal 23, which is formed on the surface of the insulating film 24 and on the inner wall of the openings 24a and 24b, as a current pathway.

A plurality of metal pillars 31 are provided below the n-side electrode pad 21. The metal pillars 31 are separated from each other, and one end of each of the metal pillars 31 is joined to a common n-side electrode pad 21.

Similarly, a plurality of metal pillars 31 are provided below the p-side electrode pad 22. The metal pillars 31 are separated from each other, and one end of each of the metal pillars 31 is joined to a common p-side electrode pad 22.

The n-side electrode pad 21, the p-side electrode pad 22, and the periphery of each of the metal pillars 31 are covered with a resin 35 that is an insulating material. The resin 35 functions to support the metal pillars 31, and is preferably made of a material that has a coefficient of thermal expansion equal or near to that of a circuit substrate and the like, i.e., a mounting destination. As examples of such a resin 35, epoxy resin, silicone resin, fluorine resin, and the like are given.

The metal pillars 31 may be formed by the electrolytic plating method using a seed metal 25, which is formed on the surface of the resin 35 and on the inner surface of a hole formed in the resin 35, as a current pathway after forming the resin 35.

The first semiconductor layer 13 is electrically connected to the metal pillars 31 via the n-side electrode 16 and the n-side electrode pad 21. The second semiconductor layer 14 is electrically connected to the metal pillars 31 via the p-side electrode 17 and the p-side electrode pad 22.

A pad 30 that is shared by a plurality of the metal pillars 31 is provided at an end (tip) of each of the metal pillars 31 on the side opposite to the other end joined to the metal pad 21 or 22. The pad 30 is formed integrally with metal pillars 31 during plating for forming the metal pillars 31, for example. The pads 30 are formed on portions of the resin 35 opposed to the electrode pads 21 and 22 via the metal pillars 31. The under surface of the pad 30 is exposed from the resin 35. An external terminal 41 such as a solder ball and a metal bump is provided on the under surface of the pad 30. The semiconductor device illustrated in FIG. 1 is mounted on a circuit substrate and the like via these external terminals 41.

Figure 2:
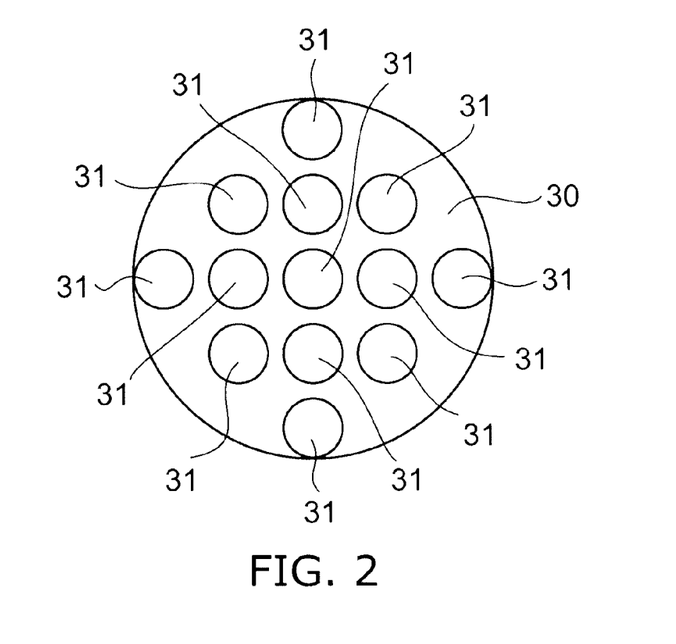
FIG. 2 is a schematic view illustrating a planar layout of the main components of the semiconductor device.

Here, the pad 30 and the external terminal 41 formed therebelow are formed with a larger diameter than the metal pillar 31. FIG. 2 illustrates an example of the planar layout of a plurality of metal pillars 31 with respect to the pad 30. Thirteen metal pillars 31, for example, are disposed with respect to one n-side electrode pad 21 equally in the planar direction of the n-side electrode pad 21.

As shown in FIG. 2, an area of the metal pillars 31 in a plan view is smaller than an area of the pad 30 in a plan view. The area of the metal pillars 31 in a plan view is smaller than an area of the external terminal 41 in a plan view.

Copper, gold, nickel, silver, and the like may be used as the material of the n-side electrode pad 21, the p-side electrode pad 22, and the metal pillars 31. Out of these, copper, which has a good thermal conductivity, a high migration tolerance, and a good adhesion to an insulating film, is more preferable.

On the light extraction surface 15 of the light-emitting element 12, a phosphor layer 42 is provided to oppose to the light extraction surface 15. The phosphor layer 42 can absorb the light from the light-emitting layer and emit a wavelength-converted light. Accordingly, a mixed light of the light from the light-emitting layer and the wavelength-converted light at the phosphor layer 42 can be emitted. For example, in the case where the light-emitting layer is nitride type, blue light from the light-emitting layer and yellow light that is a wavelength-converted light at the yellow phosphor layer 42, for example, can be mixed to obtain the white, the warm white, and the like as a mixed color.

Further, lenses 43 made of quartz glass or the like are provided on the phosphor layer 42. A mixed light of the white, the warm white, and the like is concentrated with the lens 43, and thus high brightness is easily obtained.

According to the semiconductor device of this embodiment, even if it is mounted on a circuit substrate and the like and a stress is generated which may cause misaligning of the light-emitting element 12 and the circuit substrate relatively in the planar direction, due to a difference in coefficient of thermal expansion between both, then the metal pillar 31 can absorb the stress. Thereby, shear strength at the joining section of the external terminal 41 and the circuit substrate can be increased, and thus high reliability is obtained.

Furthermore, according to this embodiment, the metal pillar 31 having a high aspect ratio can be obtained without increasing the height of the metal pillar 31, by making the metal pillar 31 sufficiently fine. A high aspect ratio of the metal pillar 31 can provide higher stress relaxation effects. Here, the aspect ratio indicates the ratio of the height of the metal pillar 31 to the width (or diameter) thereof.

Even if each metal pillar 31 is fine, a decrease in joining strength and an increase in electrical resistance between the pad 30 and the external terminal 41 via the metal pillar 31 can be suppressed by providing a plurality of metal pillars 31 for one pad 30. Furthermore, the planar size of the pad 30 is larger than the width of each metal pillar 31. Thereby, a large area of joining to the external terminal 41 can be ensured, and reliability can be further enhanced. Furthermore, since a high aspect ratio of the metal pillar 31 can be achieved without increasing the height of the metal pillar 31, plating cost is not increased, and neither is thinning prevented.

Furthermore, as illustrated in FIG. 2, by disposing a plurality of metal pillars 31 substantially equally in the planar direction of a corresponding pad 30, stresses can be spread over the metal pillars 31 substantially equally. Thereby, local stress concentration on a specific metal pillar 31 can be prevented, and reliability can be further enhanced.

Next, a method for manufacturing a semiconductor device according to this embodiment will now be described with reference to FIGS. 3A to 8B.

Figure 3A:
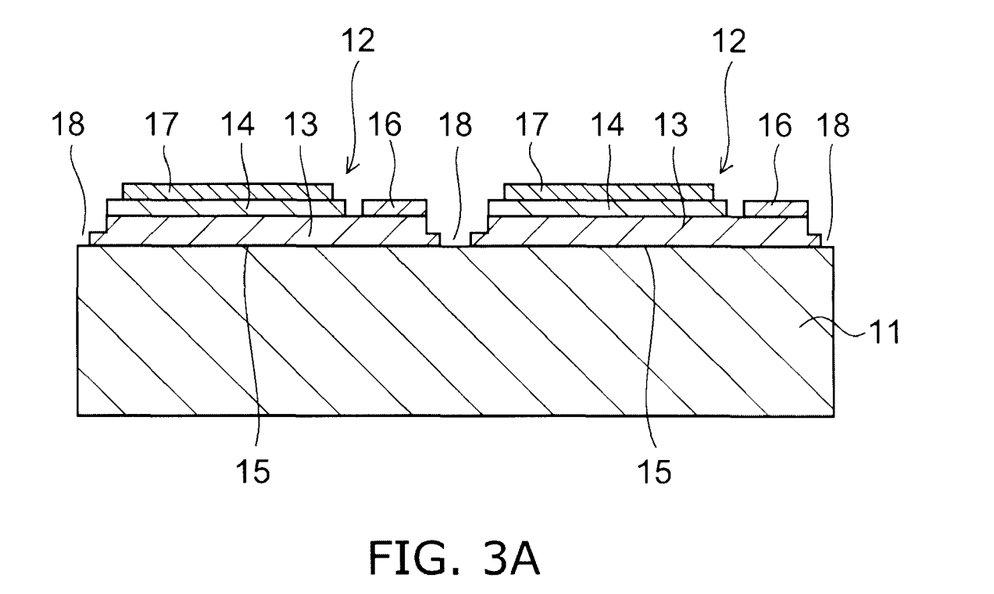

First, as illustrated in FIG. 3A, a first semiconductor layer 13 is formed on the major surface of a substrate 11, and a second semiconductor layer 14 is formed thereon. A surface of the first semiconductor layer 13 in contact with the major surface of the substrate 11 forms a light extraction surface 15. In the case where, for example, the light-emitting layer is a nitride-based semiconductor, the first semiconductor layer 13 and the second semiconductor layer 14 may be formed by crystal growth on a sapphire substrate. The second semiconductor layer 14 is patterned and selectively left on the first semiconductor layer 13. Then, a p-side electrode 17 is formed on the second semiconductor layer 14, and an n-side electrode 16 is formed on a portion of the first semiconductor layer 13 on which the second semiconductor layer 14 does not exist.

The first semiconductor layer 13 is divided into a plurality of parts on the substrate 11 by dividing trenches 18. The dividing trenches 18 are formed on the substrate 11 in a lattice form, for example. The dividing trenches 18 are formed by, for example, RIE (reactive ion etching) using a not-illustrated mask. Alternatively, the dividing trenches 18 may be formed by the laser ablation method.

Figure 3B:
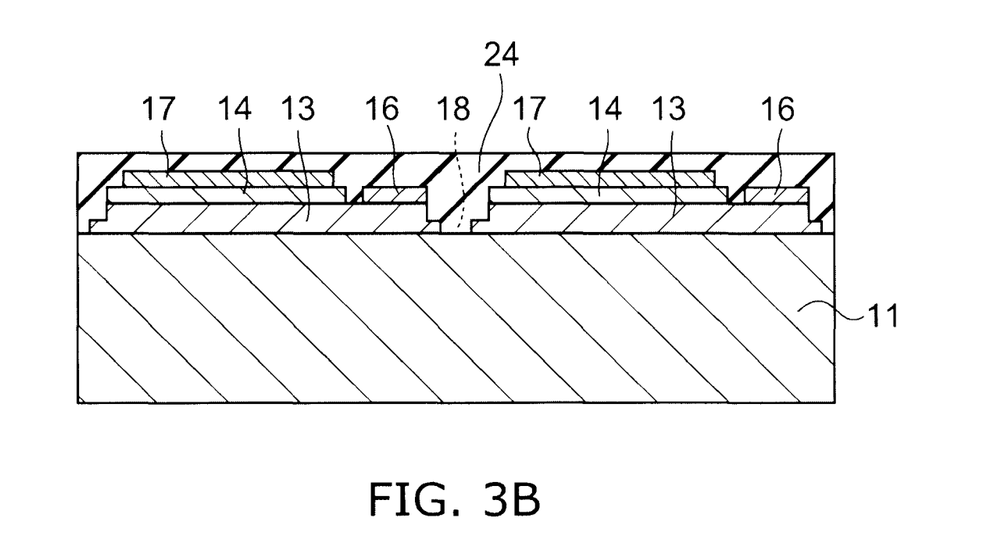
Figure 4A:
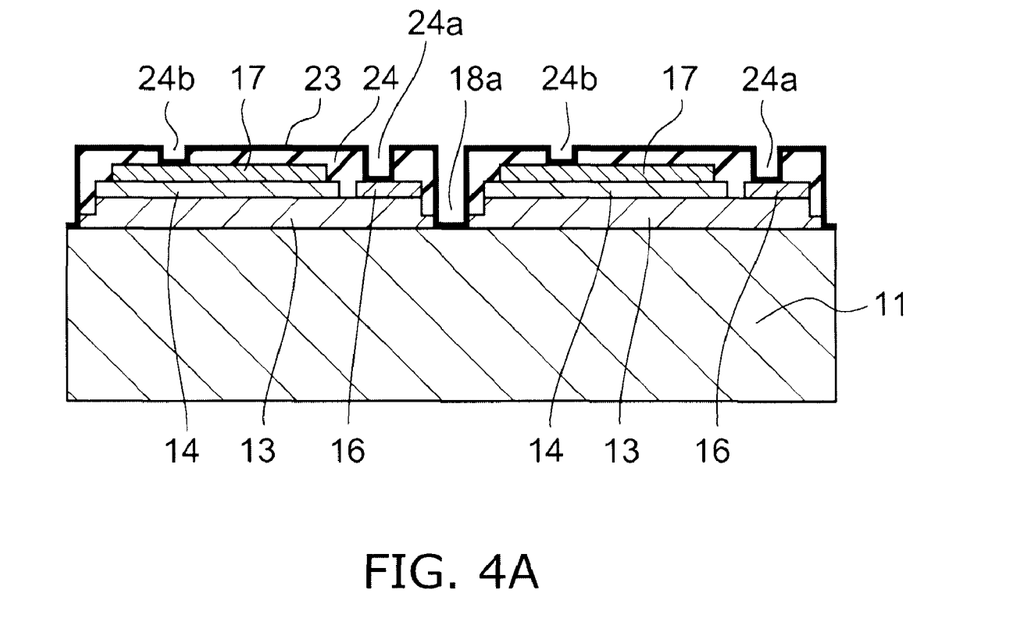

Next, as illustrated in FIG. 3B, an insulating film 24 that covers the first semiconductor layer 13, the second semiconductor layer 14, the p-side electrode 17, and the n-side electrode 16 is formed. The insulating film 24 is provided also in the dividing trenches 18. Then, as illustrated in FIG. 4A, an opening 24b reaching the p-side electrode 17 and an opening 24a reaching the n-side electrode 16 are formed in the insulating film 24. Further, the insulating film 24 in the dividing trench 18 that divides the first semiconductor layer 13 and the insulating film 24 on the dividing trench 18 are removed. Thereby, dividing trenches 18a that penetrate through the insulating film 24 and the first semiconductor layer 13 and reach the major surface of the substrate 11 are formed.

Figure 4B:
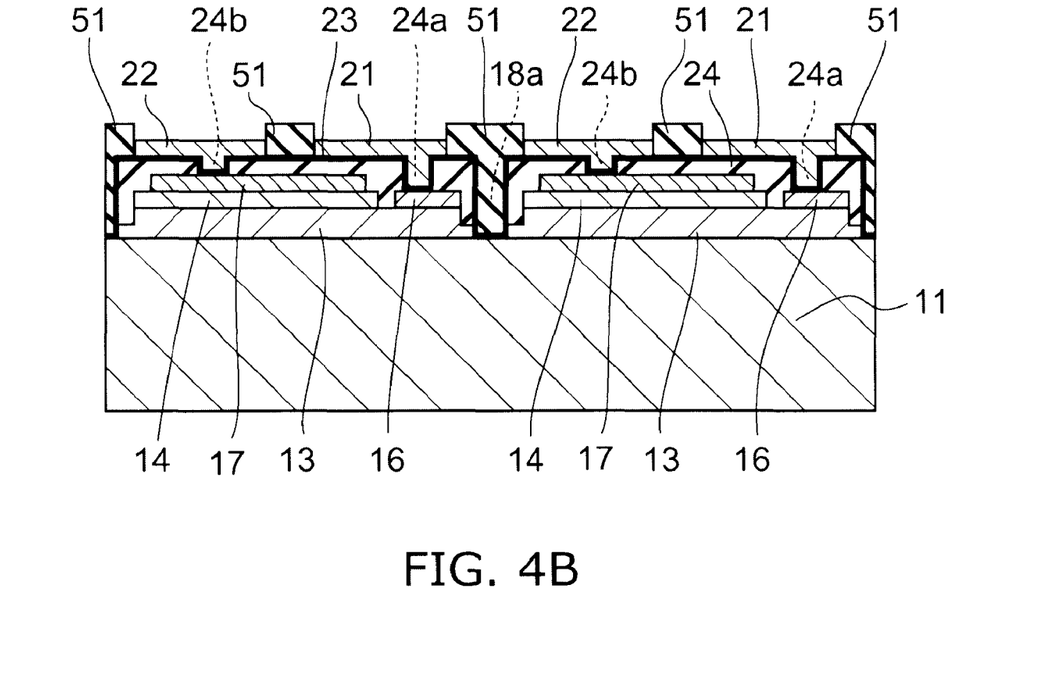

Next, a seed metal 23 is formed over the entire exposed portion including the top surface of the insulating film 24, the inner wall of the openings 24a and 24b, and the inner wall of the dividing trench 18a by, for example, sputtering. Then, as illustrated in FIG. 4B, a plating resist 51 is formed selectively on the seed metal 23. The plating resist 51 fills up the dividing trench 18 as well. Then, electrolytic plating using the seed metal 23 as a current pathway is performed.

Thereby, a p-side electrode pad 22 connected to the p-side electrode 17 is formed in the opening 24b and on the insulating film 24 therearound, and an n-side electrode pad 21 connected to the n-side electrode 16 is formed in the opening 24a and on the insulating film 24 therearound.

Figure 5A:
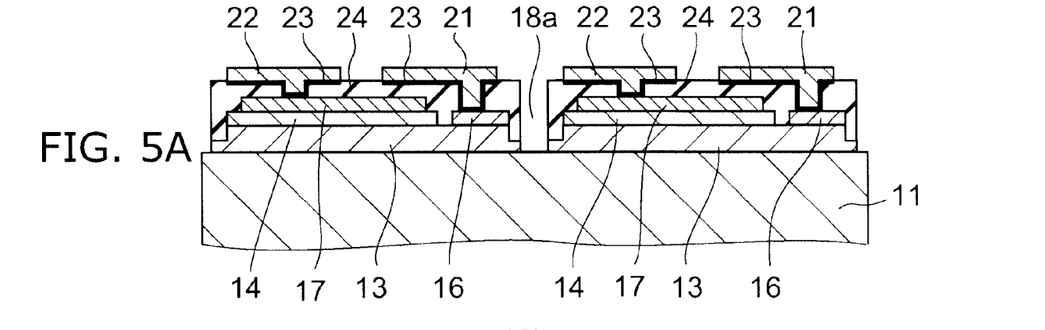

Next, after removing the plating resist 51, the exposed portion of the seed metal 23 is removed. As illustrated in FIG. 5A, the electric connection between the p-side electrode pad 22 and the n-side electrode pad 21 via the seed metal 23 is cut off. The seed metal 23 in the dividing trench 18a is also removed.

Figure 5B:
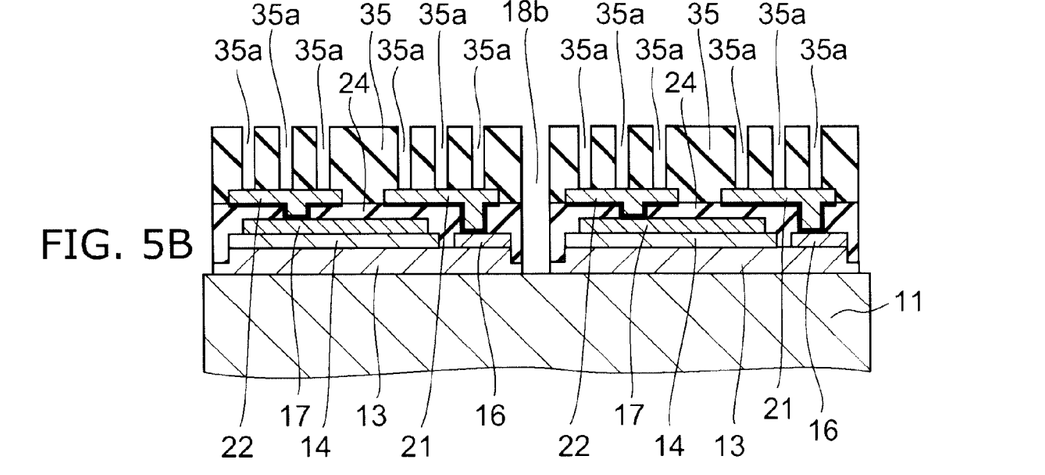
Figure 5C:
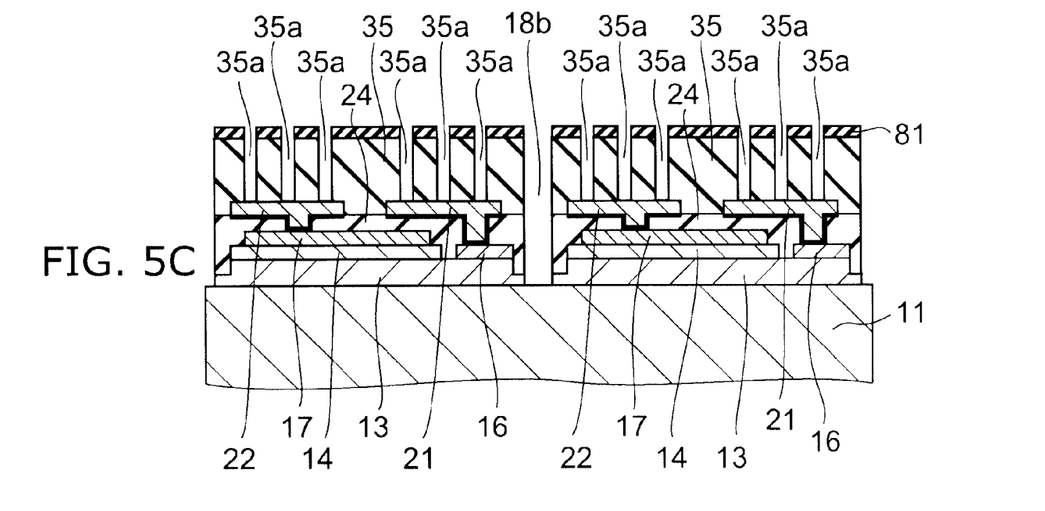

Next, as illustrated in FIG. 5B, a resin 35 that covers the n-side electrode pad 21 and the p-side electrode pad 22 is formed above the insulating film 24, and then a plurality of holes 35a are formed in the resin 35. The plurality of holes 35a penetrate through the resin 35 to reach the electrode pads 21 and 22. The holes 35a may be formed by using the photosensitivity of the resin 35, for example. Alternatively, as illustrated in FIG. 5C, the holes may be formed by RIE after forming a hard mask 81 made of an inorganic insulating film and the like on the resin 35. The hard mask 81 may be left as is or removed after the RIE processing.

The resin 35 temporarily fills up the dividing trench 18a obtained by the processes up to FIG. 5A, but the resin 35 in the dividing trench 18a and the resin 35 on the dividing trench 18a as well are removed when forming the hole 35a. Thereby, dividing trenches 18b that penetrate through the resin 35, the insulating film 24 and the first semiconductor layer 13 and reach the major surface of the substrate 11 are formed. In the case of forming the dividing trench 18b by RIE, the insulating film 24 does not need to be removed from the dividing trench 18a at the time of forming the resin 35. In this case, the insulating film 24 is also collectively removed when forming the dividing trench 18b by RIE.

Figure 6A:
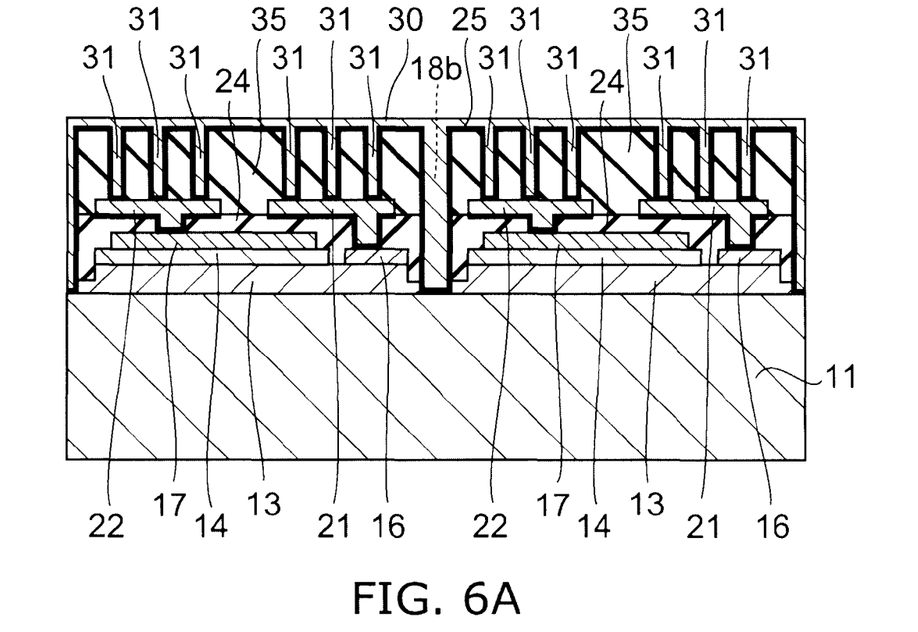

Next, as illustrated in FIG. 6A, a seed metal 25 is formed over the entire exposed surface including the inner wall of the hole 35a, the inner wall of the dividing trench 18b, and the like by sputtering, for example. Then, electrolytic plating using the seed metal 25 as a current pathway is performed. Thereby, a metal film 30 is formed in the hole 35a, in the dividing trench 18b, and on the resin 35. Portions of this metal film 30 provided in the holes 35a form the metal pillars 31 described above, which are electrically connected to corresponding electrode pads 21 and 22 via the seed metal 25. The metal film 30 covers the surface of the resin 35; therefore, the tip of the metal pillar 31 protrudes from the resin 35.

The resin 35 functions as a reinforcing resin that covers the periphery of the metal pillar 31, and further as a plating resist at the time of plating for forming the metal pillar 31. As examples of the material of the resin 35, epoxy resin, acrylic resin, polyimide resin, and the like are given.

Figure 6B:
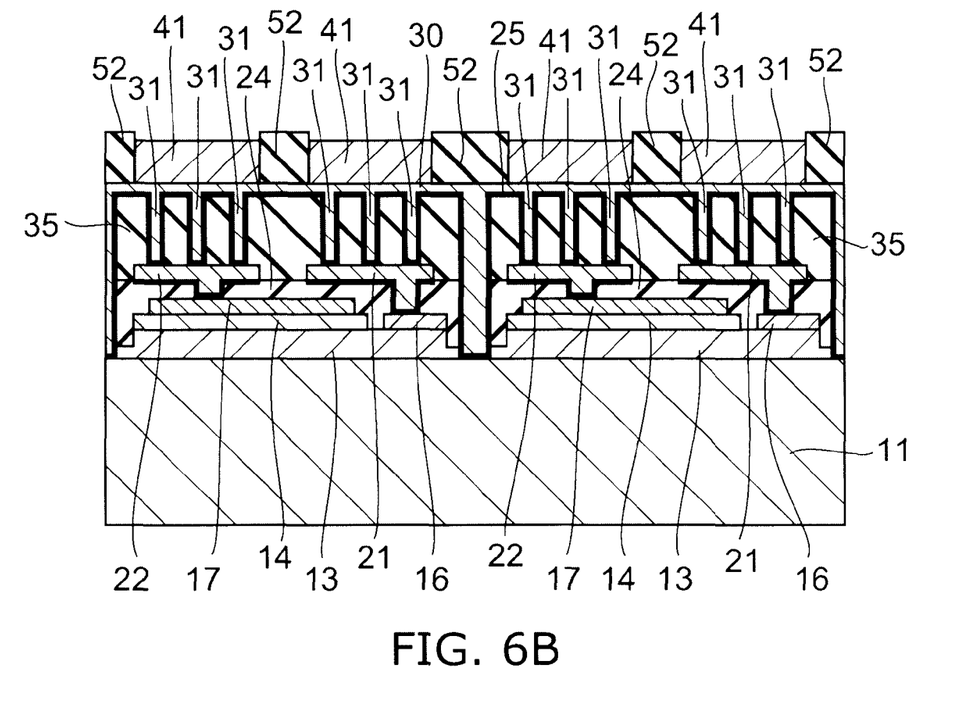

Next, as illustrated in FIG. 6B, a plating resist 52 is formed selectively on the metal film 30. The plating resist 52 covers portions of the metal film 30 other than the portions opposed to the electrode pads 21 and 22. Then, solder plating, for example, is performed while using the seed metal 25 as a current pathway. Thereby, external terminals 41 are formed on portions of the metal film 30 opposed to the electrode pads 21 and 22. The external terminal 41 is formed so as to cover the tip of the metal pillar 31 protruding from the resin 35.

Figure 7A:
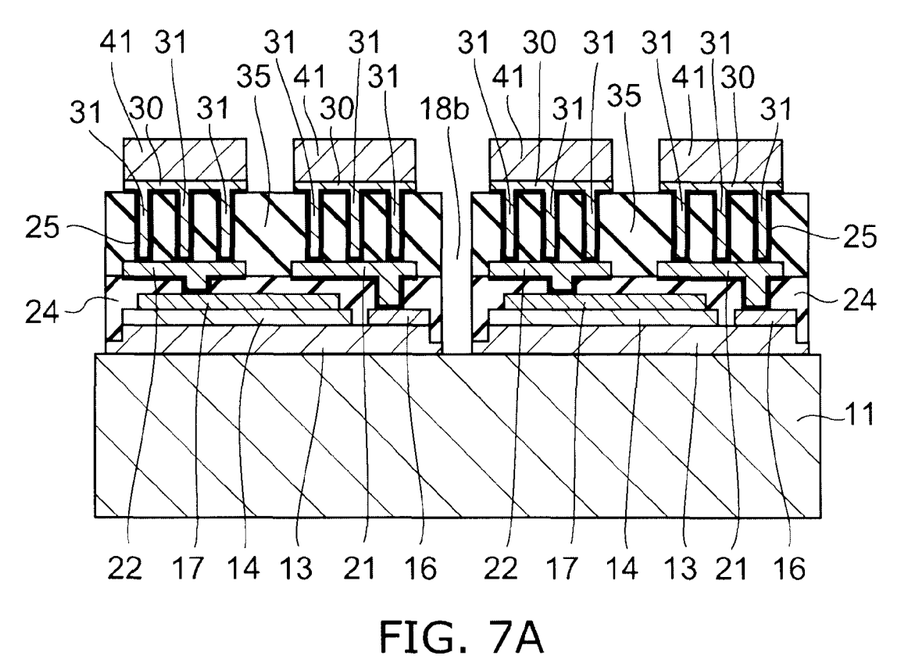

Then, after removing the plating resist 52, etching is performed while using the external terminal 41 as a mask to remove the exposed metal film 30 and the seed metal 25 therebelow. The metal film 30 and the seed metal 25 in the dividing trench 18b are also removed. Thereby, as illustrated in FIG. 7A, the electric connection between the electrode pads 21 and 22 via the metal film 30 and the seed metal 25 is cut off. Portions that are located in the metal film 30 on the surface of the resin 35, immediately below the external terminals 41, and opposed to the electrode pads 21 and 22 are left in a plate shape and serve to enhance the joining strength between the tip of the metal pillar 31 and the external terminal 41.

Figure 7B:
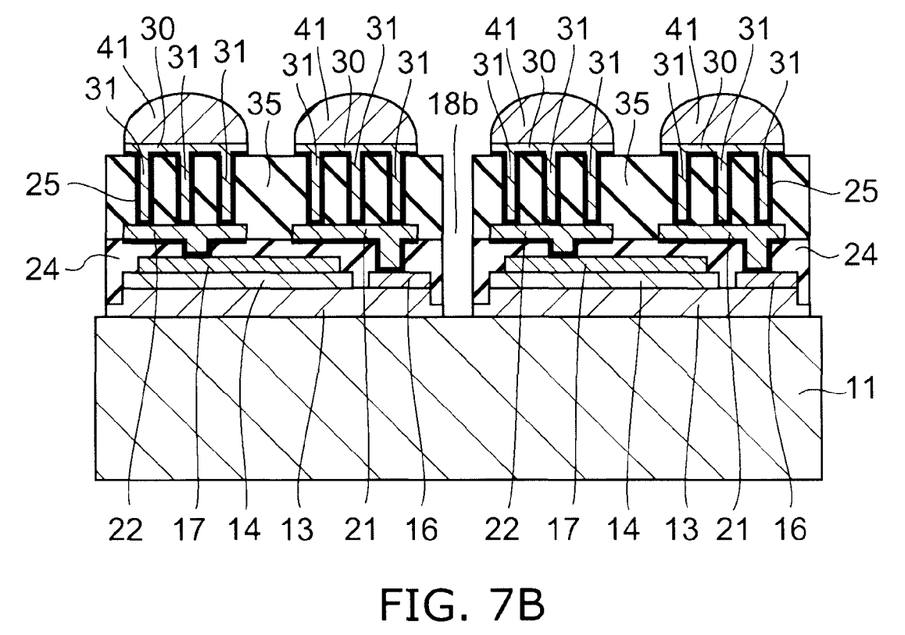

Next, the external terminal 41 made of, for example, solder is heated to the melting point or higher to melt it. Thereby, the external terminal 41 is condensed due to the surface tension to become in a ball shape, as illustrated in FIG. 7B.

In the state of FIG. 6A, the seed metal 25 and the metal film 30 are not divided but continued over the entire wafer surface. Accordingly, pattern plating using them as current pathways can be performed. Thereby, even in the case of terminals with fine pitch that are difficult to form by the ball mounting method and the like, the external terminals 41 can be formed easily over the entire wafer surface with high accuracy.

Next, the substrate 11 is stripped by using the laser lift-off method, for example. The laser light is applied toward the first semiconductor layer 13 from the back surface side of the substrate 11 opposite to the major surface on which the first semiconductor layer 13 is formed. The laser light has transmission properties to the substrate 11, and has a wavelength at which the laser light is absorbed in the first semiconductor layer 13.

When the laser light reaches the interface between the substrate 11 and the first semiconductor layer 13, the first semiconductor layer 13 near the interface absorbs the energy of the laser light to be decomposed. In the case where, for example, the first semiconductor layer 13 is GaN, it is decomposed into Ga and nitrogen gas. The Ga remains on the first semiconductor layer 13 side. By this decomposition reaction, a small gap is formed between the substrate 11 and the first semiconductor layer 13, and the substrate 11 and the first semiconductor layer 13 are separated from each other.

Figure 8A:
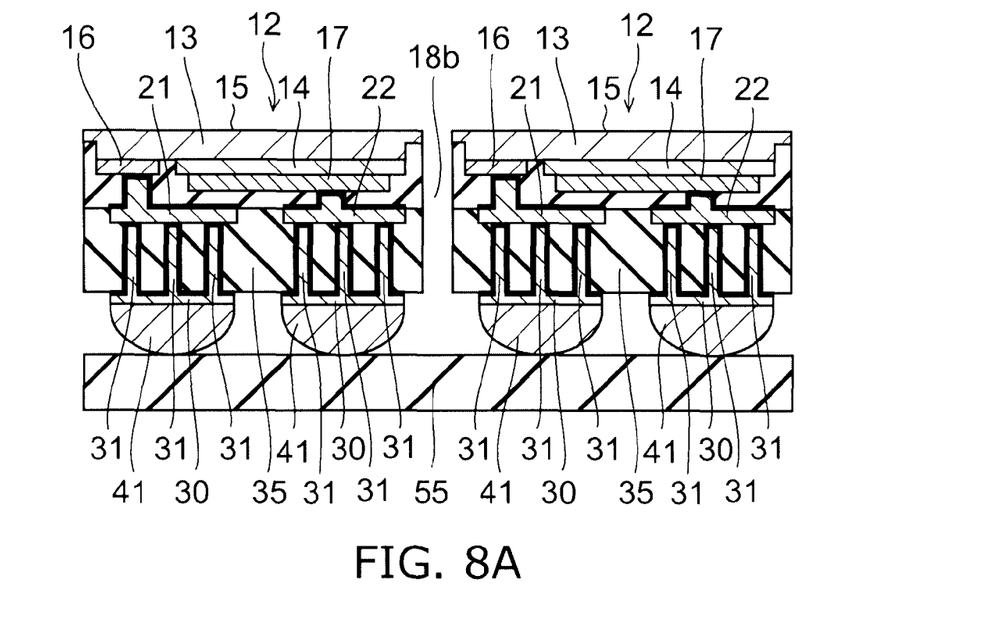

The irradiation with laser light is performed over the entire wafer multiple courses for respective set regions to remove the substrate 11. The structure on the substrate 11 is divided into a plurality of parts by the dividing trenches 18b formed in a wafer state. Therefore, when the substrate 11 is stripped, the structure is broken in due course as illustrated in FIG. 8A, and a separate dicing process is not necessary. Laser lift-off and the formation of a phosphor layer 42 and a lens 43 after that are performed in a state where the external terminal 41 is stuck on a supporting body 55 such as an adhesive sheet.

The dividing trenches 18b are collectively formed by photolithography and etching that allows performing micro processing easily with high accuracy, when being in a wafer state. Therefore, the dividing trench 18b can be made fine to the utmost limit that is possible from the viewpoint of process. Therefore, the ratio of the device area in the wafer surface can be made large for that. As a result, the number of chips obtainable from one wafer can be increased, and the cost is reduced.

Figure 8B:
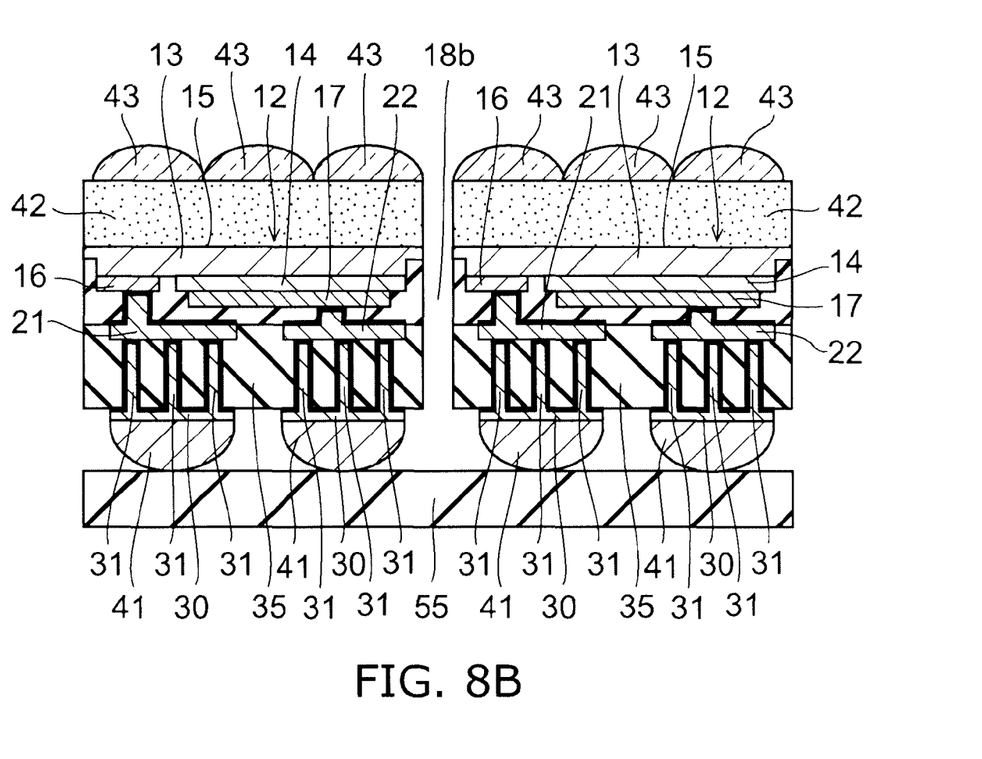

After stripping the substrate 11, the phosphor layer 42 is formed on the light extraction surface 15 and the lenses 43 are formed on the phosphor layer 42, as illustrated in FIG. 8B. Since there is no substrate 11 between the light extraction surface 15 and the phosphor layer 42, light extraction efficiency can be increased.

Forming the light-emitting element 12 and forming a package structure of the interconnect layer, the electrode pads 21 and 22, the resin 35, the metal pillar 31, and the like are collectively performed in a wafer state. Therefore, the production is possible at low cost. Furthermore, the device can be easily downsized so that the planar size of the entire semiconductor device may be made close to the planar size of a bare chip (the light-emitting element 12).

The substrate 11 may not be removed wholly but be left after ground thinly. In the case where the substrate 11 is made thin and left, higher mechanical strength can be obtained than a structure in which the substrate 11 is removed wholly, and a structure with high reliability can be provided. Furthermore, since the substrate 11 remains, warpage after fragmentation can be suppressed, which facilitates mounting on a circuit substrate and the like.

Figure 9:
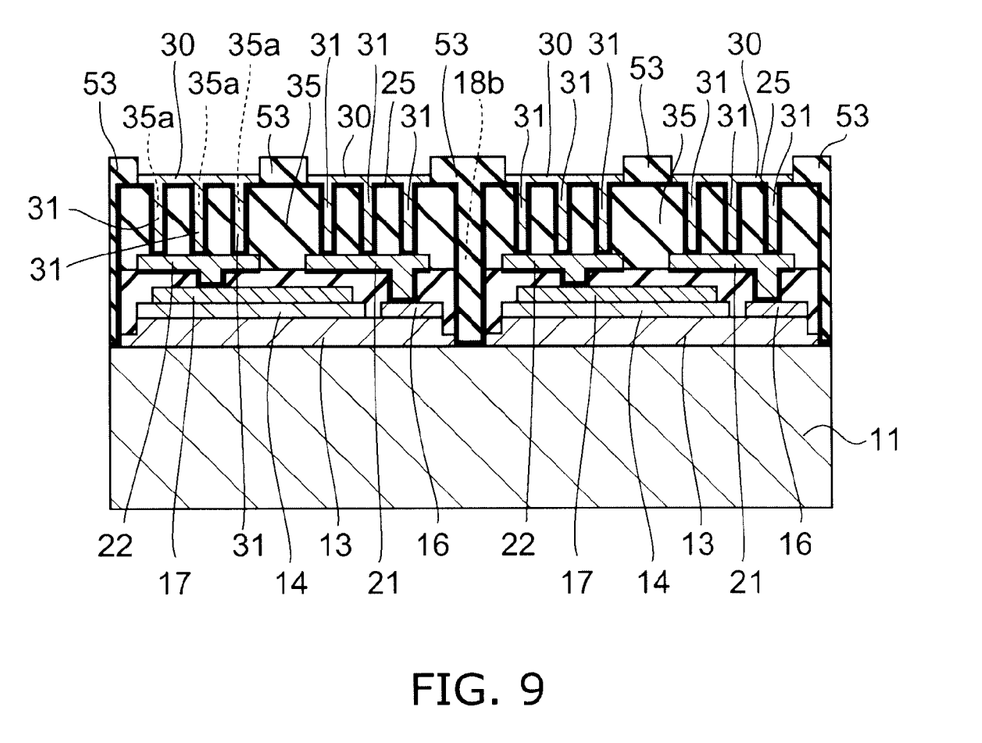
FIG. 9 is a schematic cross-sectional view illustrating another method for forming a metal pillar according to the embodiment.

Next, FIG. 9 is a schematic cross-sectional view illustrating another method for forming the metal pillar 31.

In this method illustrated in FIG. 9, the seed metal 25 is formed on the surface of the resin 35 including the inner wall surface of the hole 35a, and then a plating resist 53 is selectively formed to perform pattern plating. The plating resist 53 covers portions of the surface of the resin 35 other than the portions opposed to the electrode pads 21 and 22. The plating resist 53 fills up the dividing trench 18b as well.

After forming the metal pillars 31 by pattern plating, plating solution is changed to perform plating continuously while leaving the plating resist 53 as is. Thereby, the external terminal 41 can be formed on the plate-shaped metal film 30. Then, the state of FIG. 7A described above is obtained by removing the plating resist 53, and then like processes are continued.

FIGS. 10A to 10D illustrate another example of a method for forming the metal pillar 31 by pattern plating.

After forming the seed metal 25 on the surface of the resin 35 including the inner wall surface of the hole 35a, a plating resist 54 is formed. The plating resist 54 is formed also on the region opposed to the resin 35 that exists between adjacent holes 35a. For example, a resist film that forms the plating resist 54 is formed on the entire surface (under surface in FIGS. 10A to 10D) of the resin 35, and then openings 54a are formed at portions of the resist film opposed to the holes 35a.

Figure 10A:
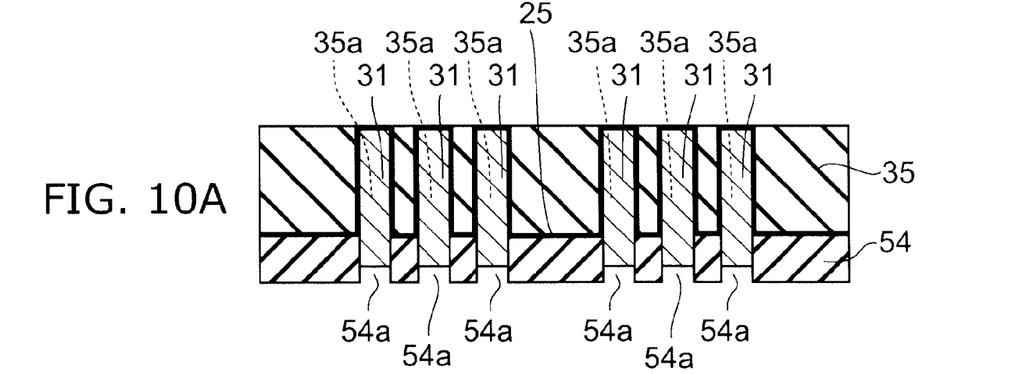
FIGS. 10A to 10D are schematic cross-sectional views of a method for manufacturing a semiconductor device according to another embodiment.

Forming the openings 54a is performed by, for example, using the photosensitivity of the plating resist 54, and at this time the resist film in the hole 35a is also removed. Here, in order to achieve a good balance between the removal of the resist 54 in the hole 35a and the patterning accuracy of the opening 54a, it is preferable that a negative resist, which does not require irradiating the inside of the hole 35a, is used as the resist 54. Further, by making the diameter of the opening 54a larger than the diameter of the hole 35a, plating characteristics described below are improved; therefore, this is a more preferable embodiment.

Then, electrolytic plating is performed while using the seed metal 25 as a current pathway to deposit a metal (for example, copper) that forms the metal pillar 31 in the hole 35a. At this time, as illustrated in FIG. 10A, the metal pillar 31 is grown also in the opening 54a of the plating resist 54. The tip of the metal pillar 31 exists within the opening 54a of the plating resist 54.

Figure 10B:
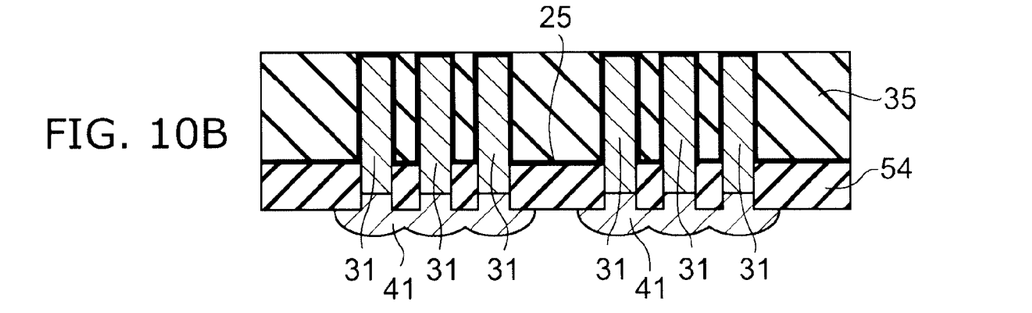

After forming the metal pillar 31, plating solution is changed to perform plating continuously while leaving the plating resist 54 as is. Thereby, as illustrated in FIG. 10B, the external terminal 41 made of, for example, solder is formed at the tip of the metal pillar 31. The external terminal 41 is continuously formed as one body for a plurality of corresponding metal pillars 31.

Figure 10C:
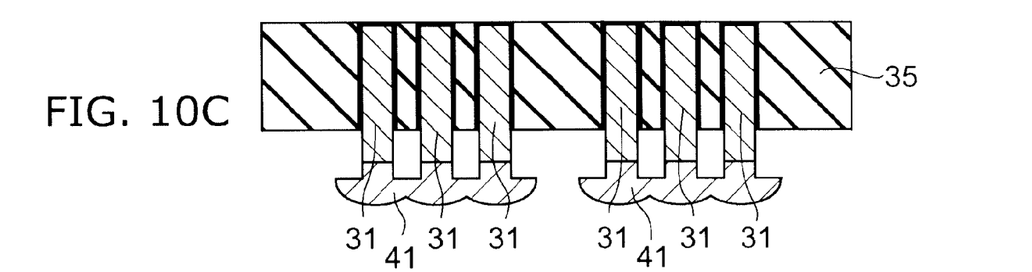
Figure 10D:
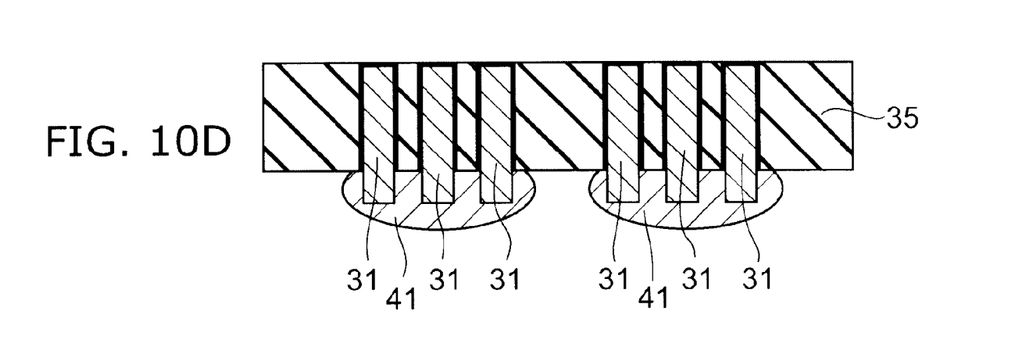

After that, as illustrated in FIG. 10C, the plating resist 54 is removed, and the exposed portions of the seed metal 25 are removed. Then, the external terminal 41 is melted. By removing the plating resist 54, the tip of the metal pillar 31 protrudes from the resin 35. The melted external terminal 41 wets and spreads also to the side surface of the tip of the metal pillar 31 which protrudes from the resin 35, and adheres to the top surface and the side surface of the tip of the metal pillar 31 so as to cover the tip of the metal pillar 31, as illustrated in FIG. 10D. If flux is applied over the entire wafer including the side surface of the metal pillar 31 when melting the external terminal 41, the wettability of the external terminal 41 to the side surface of the tip of the metal pillar 31 can be improved. Alternatively, reflow may be performed under a formic acid atmosphere or a reducing atmosphere.

According to this structure illustrated in FIG. 10D, the tip of the metal pillar 31 enters the external terminal 41 to cut into it and the external terminal 41 covers the periphery of the tip of the metal pillar 31. Therefore, the metal pillar 31 and the external terminal 41 are joined not only at one certain surface but also at a plurality of surfaces three-dimensionally to provide very high joining strength thereof, and thus high reliability is obtained.

Furthermore, when mounting on a circuit substrate and the like by pushing the external terminal 41 thereagainst while melting the external terminal 41, the tip of the metal pillar 31 that has entered the external terminal 41 contacts a pad and the like formed at the mounting surface on the circuit substrate side, and consequently comes to a stop. Thereby, a deviation in mounting position of the semiconductor device can be suppressed.

Furthermore, since the metal pillar 31 made of copper having a higher coefficient of thermal conductivity than solder that forms the external terminal 41 cuts into the external terminal 41, such a structure can achieve a higher coefficient of thermal conductivity at the joining portion of the semiconductor device and the circuit substrate than the structure illustrated in FIG. 1. Therefore, it is excellent in heat release properties, that is, the properties of releasing heat from the semiconductor device side to the circuit substrate side. The high heat release properties are advantageous particularly to a device that emits light, and can extend product lifetime.

Figure 12:
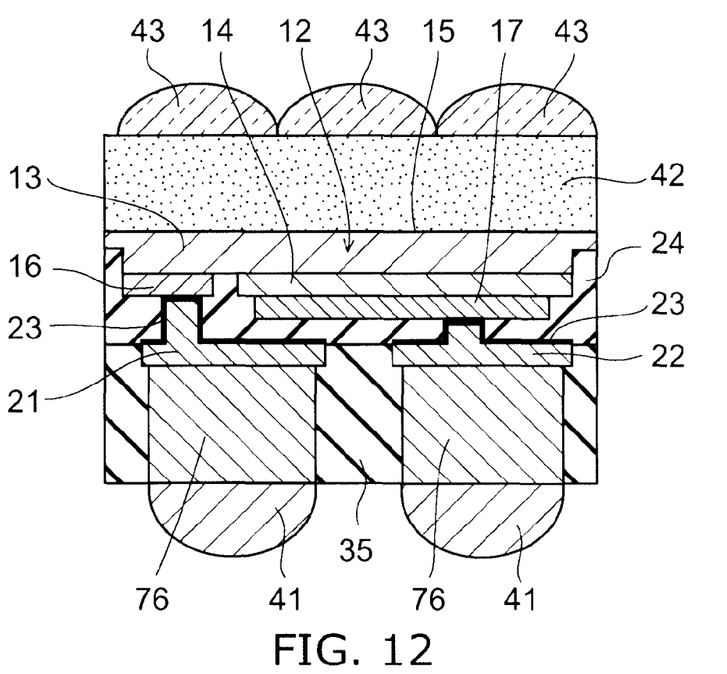
FIG. 12 is a schematic cross-sectional view of a semiconductor device according to a comparative example.

Next, results of comparing heat release properties between the structure of FIG. 10D and the structure of a comparative example illustrated in FIG. 12 will now be described. The comparative example of FIG. 12 does not include a plurality of metal pillars but includes one wide metal pillar 76 for each of electrode pads 21 and 22. The metal pillar 76 is made of copper, and has a cylindrical shape, a diameter of 120 μm, and a height of 60 µm. The external terminal 41 is made of tin, and has a diameter of 120 µm and a height of 40 µm.

In contrast, the semiconductor device that employs the structure of FIG. 10D includes thirteen metal pillars 31 for each of electrode pads 21 and 22, as illustrated in FIG. 2. Each metal pillar 31 is formed in a cylindrical shape, and has a diameter of 20 µm and a height of 20 µm. The electrode pads 21 and 22 and the metal pillar 31 are made of copper, and the external terminal 41 is made of tin.

When thermal resistances were calculated for the structure of the comparative example, the thermal resistance at the metal pillar 76 was 8.8 K/W, the thermal resistance at the external terminal 41 was 26.6 K/W, and the total thermal resistance of them was 35.4 K/W.

In contrast, the results of calculating thermal resistances for the structure of FIG. 10D were as follows. Calculations were performed assuming that thirteen metal pillars 31 are put together. With regard to thirteen metal pillars 31, the thermal resistance at the portion surrounded by the resin 35 is 8.1 K/W, the thermal resistance at the portion cutting into the external terminal 41 is 8.1 K/W, and the total of them is 16.2 K/W.

In the structure of FIG. 10D, since the metal pillar 31 made of copper cuts into the external terminal 41, the external terminal 41 is not crushed completely. Therefore, if mounting is performed while pressurizing, mounting is possible in a state where the metal pillar 31 is in contact with an electrode terminal on the mounting substrate side. Therefore, mounting under a thermal resistance of 16.2 K/W mentioned above is possible.

On the other hand, in the structure of the comparative example, since the external terminal 41 is melted completely, mounting while crushing is difficult, and the thermal resistance is 35.4 K/W that is same as the above calculation.

As mentioned above, the structure of FIG. 10D has lower thermal resistances and better heat release properties than the comparative example.

In the structure of FIG. 10D, thermal conductivity through the external terminal 41 was not considered to simplify the calculation. If thermal conductivity through the external terminal 41 is considered, the number of heat release pathways increases. Thus, heat release properties are further enhanced.

Further, although a semiconductor device including the light-emitting element 12 as a semiconductor structure unit is described in the embodiments above, the invention is applicable also to, for example, a semiconductor device in which a semiconductor integrated circuit of CMOS (complementary metal-oxide-semiconductor) and the like is formed.

Figure 11:
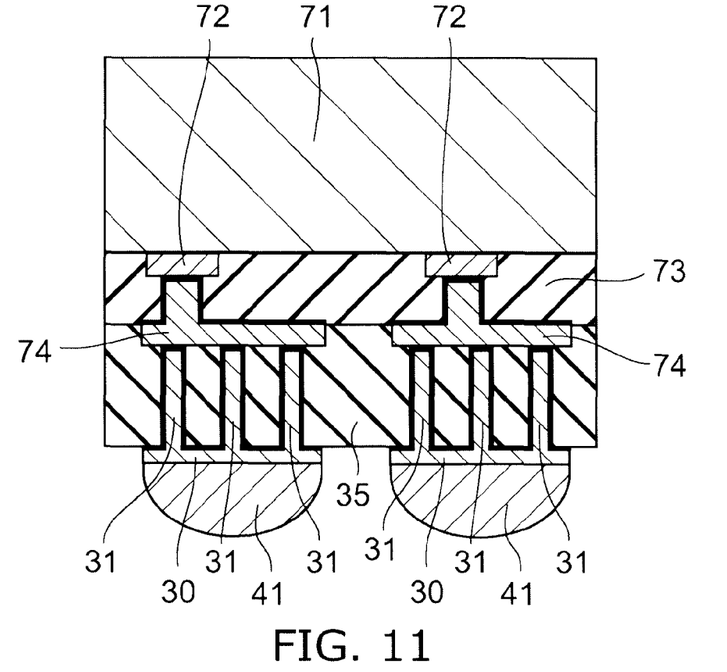
FIG. 11 is a schematic cross-sectional view of a semiconductor device according to still another embodiment.

For example, the semiconductor device illustrated in FIG. 11 includes: a semiconductor substrate 71 of silicon or the like; and a not-illustrated CMOS circuit unit formed on the major surface side thereof, as a semiconductor structure unit. Further, input and output terminals formed in the CMOS circuit unit are formed on the major surface side of the substrate 71, and they are connected to electrode pads 72 provided on the major surface side of the substrate 71.

The major surface side of the substrate 71 including the electrode pads 72 is covered with an insulating film 73. Electrode pads 74 are formed on a surface of the insulating film 73 opposite to the substrate 71. Further, an interconnect layer is formed by using a metal film that forms the electrode pad 74 as needed, and the electrode pads 74 are arranged at desired positions.

Then, a plurality of metal pillars 31 are provided on the electrode pad 74, and the electrode pad 74 is electrically connected to the external terminal 41 via the metal pillars 31. Therefore, even if the difference in coefficient of thermal expansion is large between the substrate 71 and a circuit substrate of mounting destination, the metal pillar 31 having a high aspect ratio can absorb stress and relax shear stress applied to the external terminal 41. Consequently, high joining reliability is obtained. Furthermore, even if one metal pillar 31 is fine, there are a plurality of metal pillars 31, which can prevent joining strength poverty due to reduced joining area between the metal pillar 31 and the external terminal 41.

Hereinabove, embodiments of the invention are described with reference to specific examples. However, the invention is not limited to those examples but various modifications are possible based on the technical idea of the invention. One skilled in the art may perform various design modifications on the material, the size, the shape, the layout, and the like of the substrates, the light-emitting element, the electrodes, the interconnect layers, the metal pillars, the insulating films, the resins, and the like. Such modifications also are included in the scope of the invention to the extent that they do not deviate from the spirit of the invention.

The hole, the opening and the pad in the above embodiments are not limited to a circle but an ellipse, a shape having corners and a shape having rounded corners are possible. In that case, as shown in FIG. 2, a diameter, a major axis, a minor axis and a side of the metal pillar 31 is smaller than a diameter, a major axis, a minor axis and a side of the external terminal 41. Furthermore, an area of the metal pillar 31 in a plan view is smaller than an area of the external terminal 41 in a plan view.

The invention claimed is:

1. A semiconductor device comprising:
   a semiconductor structure unit including a major surface;
   an interconnect layer provided on the major surface side of the semiconductor structure unit;
   an electrode pad provided on a surface of the interconnect layer on a side opposite to a surface on which the semiconductor structure unit is provided, and the electrode pad electrically connected to the interconnect layer;
   a plurality of metal pillars joined to the electrode pad separately from each other; and
   an external terminal provided commonly at tips of the plurality of metal pillars,
   the metal pillars having an area in a plan view smaller than an area in a plan view of the external terminal,
   wherein the semiconductor structure unit includes a light-emitting layer.

2. The device according to claim 1, wherein a pad commonly connected to the plurality of metal pillars is provided at the tips of the metal pillars, and the external terminal is joined to the pad.

3. The device according to claim 1, wherein the tips of the plurality of metal pillars are entered into the external terminal, and the external terminal covers a periphery of the tips of the plurality of metal pillars.

4. The device according to claim 3, wherein the metal pillars are made of a material having a higher coefficient of thermal conductivity than the external terminal.

5. The device according to claim 1, wherein a periphery of the metal pillars is covered with a resin.

6. The device according to claim 1, wherein the plurality of metal pillars are laid out equally in a planar direction of the corresponding electrode pad.

7. A method for manufacturing a semiconductor device comprising:
   forming an interconnect layer on a major surface of a semiconductor structure unit;

forming an electrode pad on a surface of the interconnect layer on a side opposite to a surface on which the semiconductor structure unit is provided;

forming an insulating member covering the electrode pad;

forming a plurality of holes penetrating through the insulating member to reach the electrode pad in the insulating member;

forming metal pillars in the holes; and providing an external terminal commonly joined to tips of the plurality of metal pillars and the external terminal having an area in a plan view larger than an area in a plan view of each of the metal pillars.

8. The method according to claim 7, wherein the forming the metal pillars includes forming the metal pillars so that the tips of the metal pillars are protruded from the insulating member, and the providing the external terminal includes providing the external terminal so that the external terminal covers the protruding metal pillars.

9. The method according to claim 7, wherein the forming the metal pillars includes forming a metal film on an exposed surface of the insulating member including inside of the holes by plating.

10. The method according to claim 9, wherein, after forming the metal film, selective pattern plating is performed to form the external terminal at a portion opposed to the metal pillars.

11. The method according to claim 9, wherein a portion of the metal film opposed to the electrode pad via the metal pillars is formed in a plate shape.

12. The method according to claim 7, wherein pattern plating is performed in a state where a plating resist is selectively formed on a surface of the insulating member to form the metal pillars in the holes.

13. The method according to claim 12, wherein the forming the plating resist includes:

forming a resist film over a substantially entire surface of the insulating member; and forming an opening communicating with the holes at a portion of the resist film opposed to the holes, and the metal pillars are formed also in the opening of the resist film.

14. The method according to claim 13, wherein, after forming the metal pillars, plating solution is changed to perform plating while leaving the plating resist to form the external terminal at the tips of the metal pillars.

15. The method according to claim 13, wherein the forming the metal pillars includes:

forming the metal pillars in the holes and in the opening so that the tips of the metal pillars exist within the opening; and removing the plating resist to protrude the tips of the metal pillars from the insulating member.

16. The method according to claim 14, wherein, after forming the external terminal, the plating resist is removed and the external terminal is melted to adhere the external terminal also to a periphery of the tips of the plurality of metal pillars.

17. The method according to claim 7, including forming a semiconductor layer including a light-emitting layer on a substrate as the semiconductor structure unit.

18. The method according to claim 17, including:

forming a dividing trench penetrating through the insulating member, the interconnect layer, and the semiconductor layer to reach the substrate; and removing the substrate after forming the external terminal.

19. The method according to claim 18, wherein an interface between the substrate and the semiconductor layer is irradiated with laser light to separate the substrate and the semiconductor layer.

* * * * *